(12) United States Patent
Chen et al.

(10) Patent No.: US 10,353,421 B2
(45) Date of Patent: Jul. 16, 2019

(54) CURRENT MIRROR DEVICE AND RELATED AMPLIFIER CIRCUIT

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/810,148

(22) Filed: Nov. 13, 2017

(65) Prior Publication Data

US 2018/0329443 A1 Nov. 15, 2018

(30) Foreign Application Priority Data

May 12, 2017 (TW) .............................. 106115701 A

(51) Int. Cl.

| | |
|---|---|
| *H03F 3/04* | (2006.01) |
| *G05F 3/26* | (2006.01) |
| *H03F 3/193* | (2006.01) |
| *H03F 1/02* | (2006.01) |
| *H03F 1/22* | (2006.01) |
| *H03F 3/195* | (2006.01) |

(52) U.S. Cl.
CPC ........... *G05F 3/262* (2013.01); *H03F 1/0205* (2013.01); *H03F 1/223* (2013.01); *H03F 3/193* (2013.01); *H03F 3/195* (2013.01); *H03F 2200/168* (2013.01); *H03F 2200/18* (2013.01); *H03F 2200/267* (2013.01); *H03F 2200/301* (2013.01); *H03F 2200/312* (2013.01); *H03F 2200/451* (2013.01)

(58) Field of Classification Search
CPC .............................. H03F 3/04; H03F 2200/474
USPC ................................. 330/288; 323/315, 316
See application file for complete search history.

(56) References Cited

U.S. PATENT DOCUMENTS

| | | |
|---|---|---|
| 4,446,419 A | 5/1984 | van de Plassche |
| 5,212,458 A | 5/1993 | Fitzpatrick |
| 5,666,046 A | 9/1997 | Mietus |
| 5,867,012 A | 2/1999 | Tuthill |
| 6,194,967 B1 | 2/2001 | Johnson |
| 6,356,153 B1 | 3/2002 | Ivanov |

(Continued)

*Primary Examiner* — Steven J Mottola
(74) *Attorney, Agent, or Firm* — Winston Hsu

(57) ABSTRACT

A current mirror device includes an input end for receiving an input signal, an output end for outputting an amplified signal of the input signal, first through third transistors, and an operational amplifier. The first transistor includes a first end coupled to first reference current and a second end coupled to a bias voltage. The control end of the second transistor is coupled to the input end. The third transistor includes a first end coupled to the output end, a second end coupled to the first end of the second transistor and a control end coupled to a reference voltage. The operational amplifier is configured to keep a first voltage and a second voltage at substantially the same level, wherein the first voltage is obtained on the first end of the first transistor and the second voltage is obtained on the first end of the second transistor. Therefore, the reference current flowing through the first transistor can be accurately amplified to a desired value and mirrored to become load current flowing through the second transistor.

18 Claims, 5 Drawing Sheets

(56) References Cited

U.S. PATENT DOCUMENTS

2005/0231270 A1  10/2005  Washburn
2006/0038618 A1*  2/2006  Wang ..................... G05F 3/262
                                                              330/288

* cited by examiner

CURRENT MIRROR DEVICE AND RELATED AMPLIFIER CIRCUIT

CROSS REFERENCE TO RELATED APPLICATION

This application claims priority of Taiwan application No. 106115701, which was filed on 2017 May 12.

TECHNICAL FIELD

The present invention is related to a current mirror device and an amplifier circuit, and more particularly, to a current mirror device and an amplifier circuit capable of improving the stability and accuracy of output current.

BACKGROUND

As a common component in analog circuits, current mirrors are widely applied in the biasing stage or the amplifying stage. Therefore, the stability and the accuracy of the output current are crucial to the quality of a current mirror.

A prior art current mirror device is normally implemented using metal-oxide-semiconductor field effect transistors (MOSFETs). The effective channel length of a MOSFET remains constant when operating in the linear region. As the drain voltage increases, the MOSFET enters the saturation region. Ideally, the operational current of the MOSFET in the saturation is only related to the gate-source voltage ($V_{GS}$) of the MOSFET. However in reality, the increased drain voltage shortens the effective channel length of the MOSFET, also known as channel length modulation effect which makes the operational current of the MOSFET also related to the drain-source voltage ($V_{DS}$) of the MOSFET. Therefore, the prior art current mirror device is easily influenced by process and bias variations, thus unable to accurately provide the output current.

SUMMARY

An embodiment of the present invention provides an amplifier circuit which includes an input end arranged to receive an input signal, an output end arranged to output the input signal after being amplified, first through third transistors, and an operational amplifier. The first transistor includes a first end arranged to receive first reference current, a second end arranged to receive a first bias voltage, and a control end. The second transistor includes a first end, a second end coupled to the first bias voltage, and a control end coupled to the input end and the control end of the first transistor. The third transistor includes a first end coupled to the output end, a second end coupled to the first end of the second transistor, and a control end coupled to a reference voltage. The operational amplifier is configured to keep a first voltage level at the first end of the first transistor substantially equal to a second voltage level at the first end of the second transistor.

An embodiment of the present invention provides a current mirror device which includes first through fifth transistors and an operation amplifier. The first transistor includes a first end arranged to receive first reference current, a second end coupled to a first bias voltage, and a control end. The second transistor includes a first end, a second end coupled to the first bias voltage, and a control end coupled to the control end of the first transistor. The third transistor includes a first end, a second end coupled to the first end of the second transistor, and a control end coupled to a reference voltage. The fourth transistor includes a first end, a second end coupled to the first bias voltage, and a control end. The fifth transistor includes a first end coupled to a second bias voltage, a second end coupled to the first end of the fourth transistor, and a control end coupled to the control end of the third transistor. The operational amplifier includes a first end coupled to the first end of the fourth transistor, a second end coupled to the first end of the first transistor, and an output end coupled to the control end of the first transistor.

DETAILED DESCRIPTION

Figure 1:
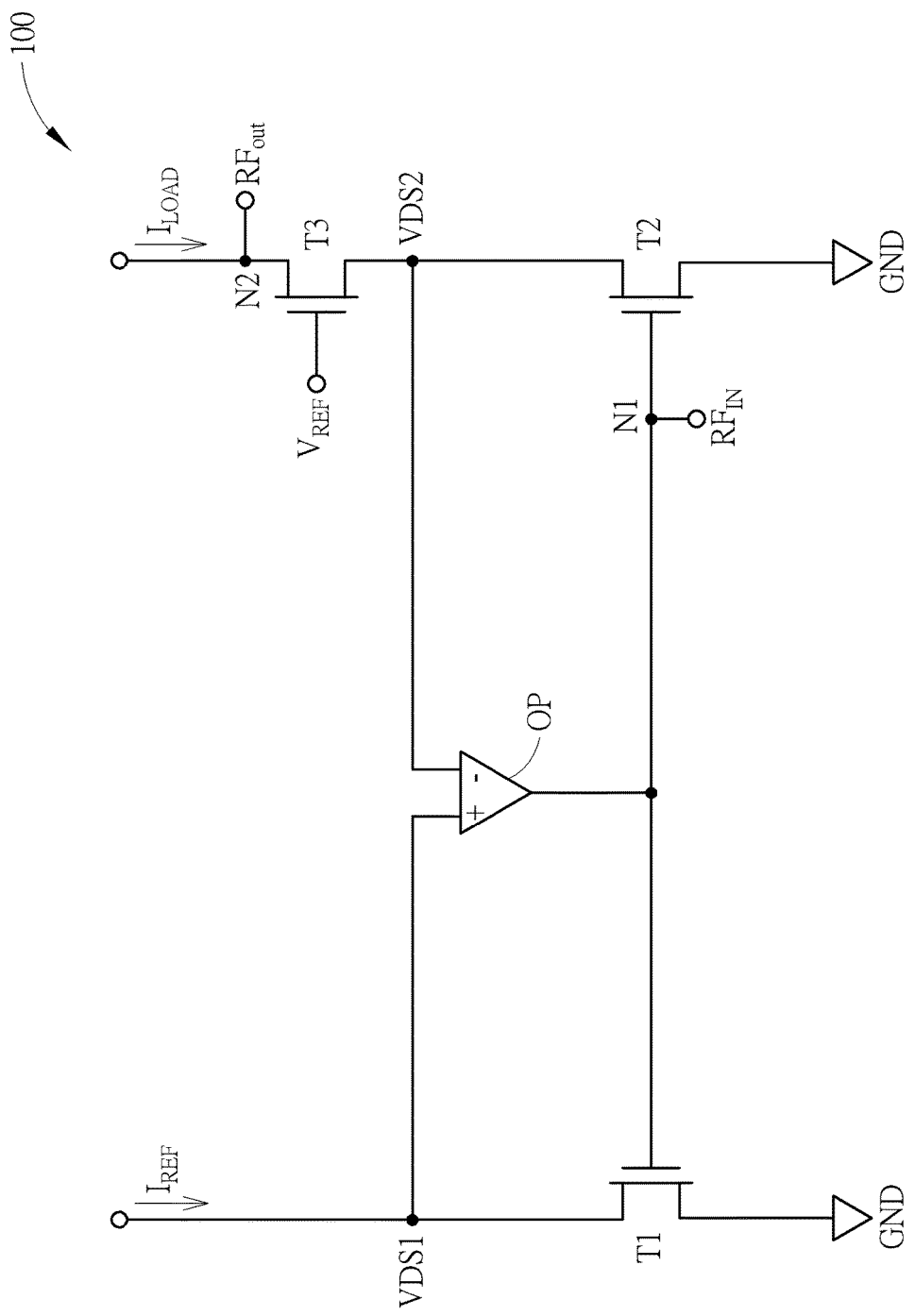
FIG. 1 is a diagram illustrating an amplifier circuit according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
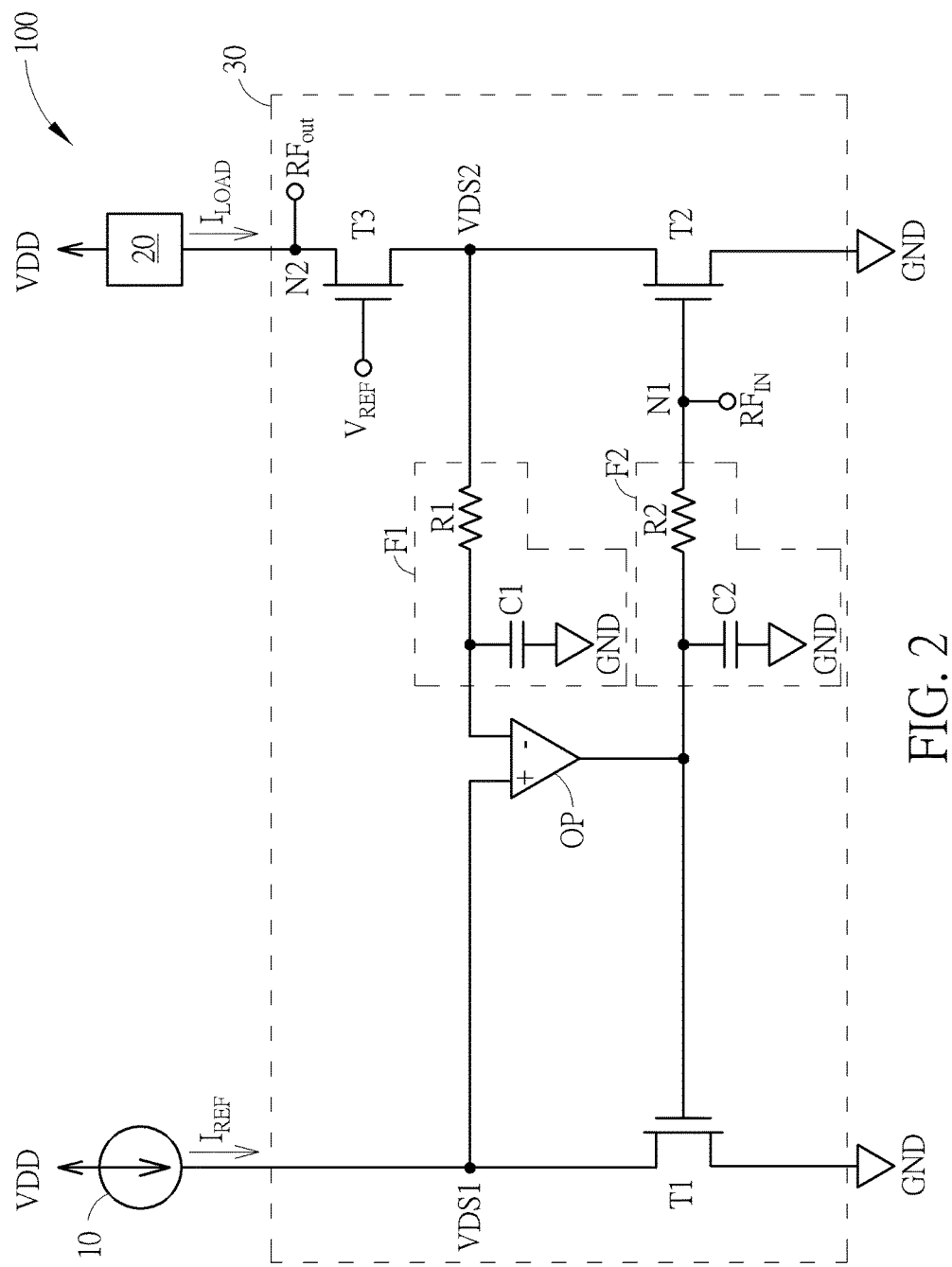
FIG. 2 is a diagram illustrating the application of the amplifier circuit according to an embodiment of the present invention.

FIG. 1 is a diagram illustrating an amplifier circuit 100 according to an embodiment of the present invention. FIG. 2 is a diagram illustrating the application of the amplifier circuit 100 according to an embodiment of the present invention. In FIG. 2, the amplifier circuit 100, coupled to a current source 10, includes an input end N1, an output end N2, and a current mirror device 30. The current mirror device 30 includes transistors T1-T3 and an operational amplifier OP. In another embodiment of the present invention, the amplifier circuit 100 may further be coupled to a load circuit 20, and the current mirror device 30 may further include resistors R1-R2 and capacitors C1-C2. VDD and GND present the bias voltages required to operate the amplifier circuit 100, wherein the bias voltage VDD may be the power voltage and the bias voltage GND may be ground, common or return voltage. The load circuit 20 may be an inductor coupled between the bias voltage VDD and the first end of the transistor T3. The current mirror device 30 is configured to amplify the reference current $I_{REF}$ generated by the current source 10 to become the load current $I_{LOAD}$ which flows through the transistor T3. In another embodiment of the present invention, the load current $I_{LOAD}$ which flows through the transistor T3 also flows through the load circuit 20. The amplifier circuit 100 is configured to receive an input signal $RF_{IN}$ at the input end N1. The load circuit 20 is configured to amplify the input signal $RF_{IN}$ to become an output signal $RF_{OUT}$ according to the load current $I_{LOAD}$, and provide the output signal $RF_{OUT}$ at the output end N2.

In the current mirror device 30, the operational amplifier OP and the transistors T1-T3 are three-terminal devices. With a first end serving as positive input end, a second end serving as negative input end, and a third end serving as output end, the operational amplifier OP can provide high input impedance and low output impedance. The first transistor T1 includes a first end coupled to the current source 10 for receiving the reference current $I_{REF}$, a second end coupled to the bias voltage GND, and a control end coupled to the output end of the operational amplifier OP. The second transistor T2 includes a first end coupled to the second end of the transistor T3, a second end coupled to the bias voltage GND, and a control end coupled to the input end N1 and the control end of the transistor T1. The transistor T3 includes a first end coupled to the output end N2, a second end coupled to the first end of the transistor T2, and a control end coupled to a reference voltage $V_{REF}$. The resistor R1 includes a first end coupled to the second end of the operational amplifier OP, and a second end coupled between the first end of the transistor T2 and the second end of the transistor T3. The resistor R2 includes a first end coupled to the control end of the transistor T1 and the output end of the operational amplifier OP, and a second end coupled to the input end N1 and the control end of the transistor T2. The capacitor C1 includes a first end coupled between the second end of the operational amplifier OP and the resistor R1, and a second end coupled to the bias voltage GND. The capacitor C2 includes a first end coupled between the resistor R2 and the control end of the transistor T1, and a second end coupled to the bias voltage GND. The operational amplifier OP is configured to keep a first voltage level at the first end of the transistor T1 substantially equal to a second voltage level at the first end of the transistor T2.

In the amplifier circuit 100 of an embodiment of the present invention, the resistor R1 and the capacitor C1 may form a filter circuit F1, while the resistor R2 and the capacitor C2 may form a filter circuit F2 so as to allow certain frequencies to pass. For example, the filter circuit F 1 and the filter circuit F2 form a low-pass filter, thereby preventing the alternating-current (AC) signals (such as high-frequency signals) in the input signal $RF_{IN}$ to be transmitted to the operational amplifier OP and hinder its operation. In this embodiment, the filter circuit F1 is coupled between the first end of the transistor T2 and the second end of the operational amplifier OP, and the filter circuit F2 is coupled between the control end of the transistor T1 and the input end N1. In other embodiments of the present invention, the resistor R1 or R2 may be substituted by an inductor or by an inductor-capacitor parallel circuit. However, the method of implementing the filter circuit in the amplifier circuit 100 does not limit the scope of the present invention.

When fabricating transistors on a wafer, the speed of electron migration varies with wafer location, and the transistor characteristics may differ with applied voltages or temperatures. In semiconductor manufacturing, a process corner is an example of a design-of-experiments technique that refers to a variation of fabrication parameters used in applying integrated circuit designs to semiconductor wafers, such as process/voltage/temperature (PVT). For example, the corners related to electron migration speed include SS, S, TT, F and FF parameters. When two transistors are located in the same corner or in neighboring corners, it means these two transistors do not have large process variations in fabrication parameters. When two transistors are located in different separate corners, it means these two transistors may have large process variations in fabrication parameters.

In the amplifier circuit 100 of an embodiment of the present invention, the transistors T1-T3 may be MOSFETs or other devices having similar functions. In the current mirror device 30 formed by the transistors T1-T3, the width/length (W/L) ratio of the transistor T2 is m times larger than the W/L ratio of the transistor T1, wherein m is a positive integer. Also, the transistors T1 and T2 vary in fabrication parameters in a consistent direction. That is, the transistors T1 and T2 are located in the same corner or in neighboring corners. For illustrative purposes, it is assumed that the current mirror device 30 is implemented with N-type MOSFETs, each of which has a drain (first end), a source (second end), and a gate (control end). However, the types of the transistors T1-T3 do not limit the scope of the present invention.

As previously stated, a current mirror device may not be able to supply output current which is an accurate copy of input current due to channel length modulation effect. Therefore, in the amplifier circuit 100 of an embodiment of the present invention, the drain voltages of the transistors T1 and T2 are locked using the electrical characteristic of the operational amplifier OP (high input impedance and low output impedance), and the gate voltages of the transistors T1 and T2 are locked using a feedback mechanism. More specifically, the drain voltage VDS1 of the transistor T1 is supplied by the reference current $I_{REF}$, while the drain voltage VDS2 of the transistor T2 is supplied by the load circuit 20 and the transistor T3. Meanwhile, the operational amplifier OP is configured to drive the gates of the transistors T1 and T2 so as to lock the drain voltages of the transistors T1 and T2 (VDS1=VDS2). An embodiment of the present invention is able to reduce the impact of the transistor bias current variations on the PVT by keeping the drain voltages of the transistors T1-T2 substantially at the same level. Since the W/L ratio of the transistor T2 is m times larger than the W/L ratio of the transistor T1, the reference current flowing through the transistor T1 may be amplified m times to become the load current $I_{LOAD}$ flowing through the transistor T2 ($I_{LOAD}=m*I_{REF}$).

Figure 3:
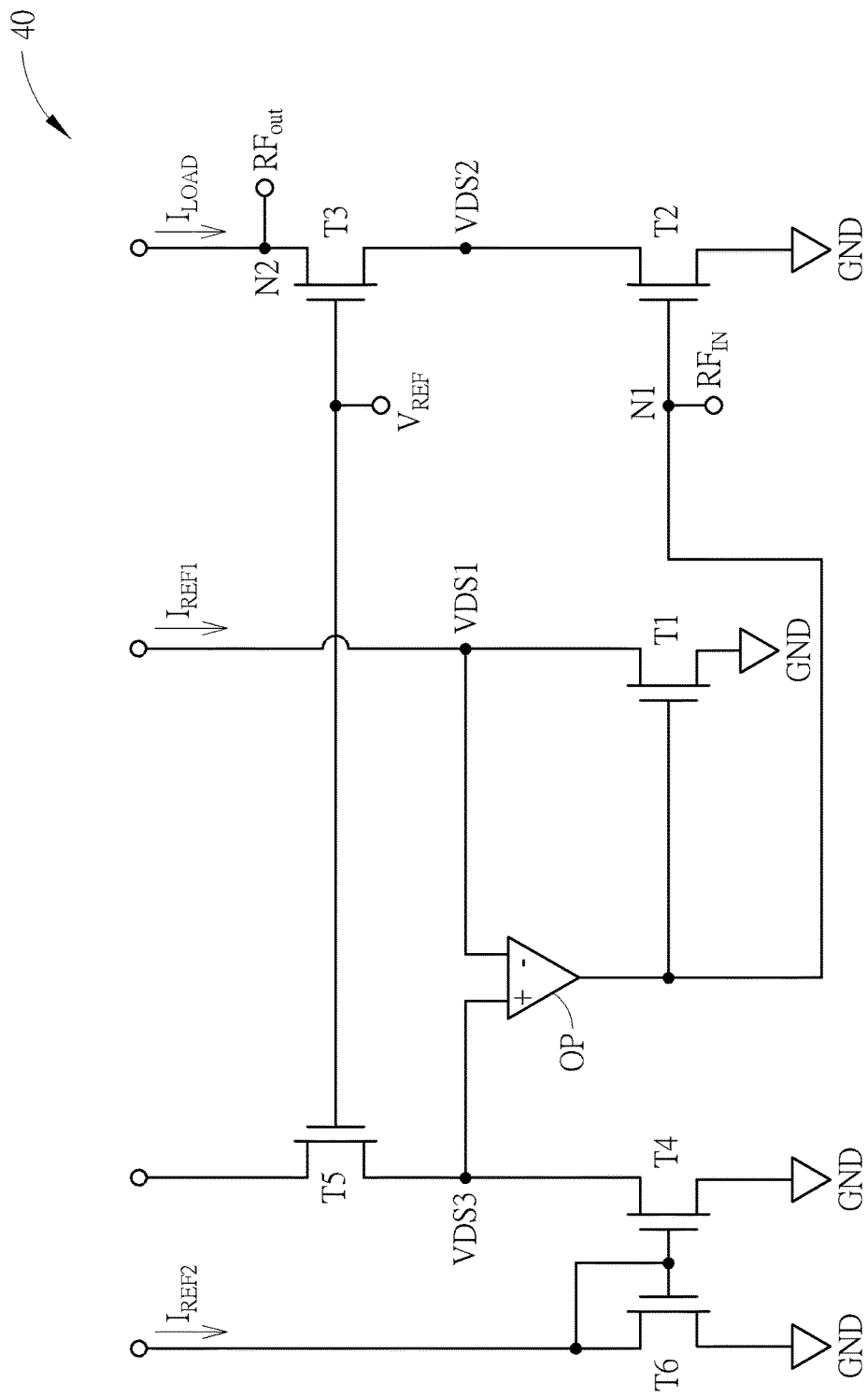
FIG. 3 is a diagram illustrating a current mirror device according to another embodiment of the present invention.
Figure 4:
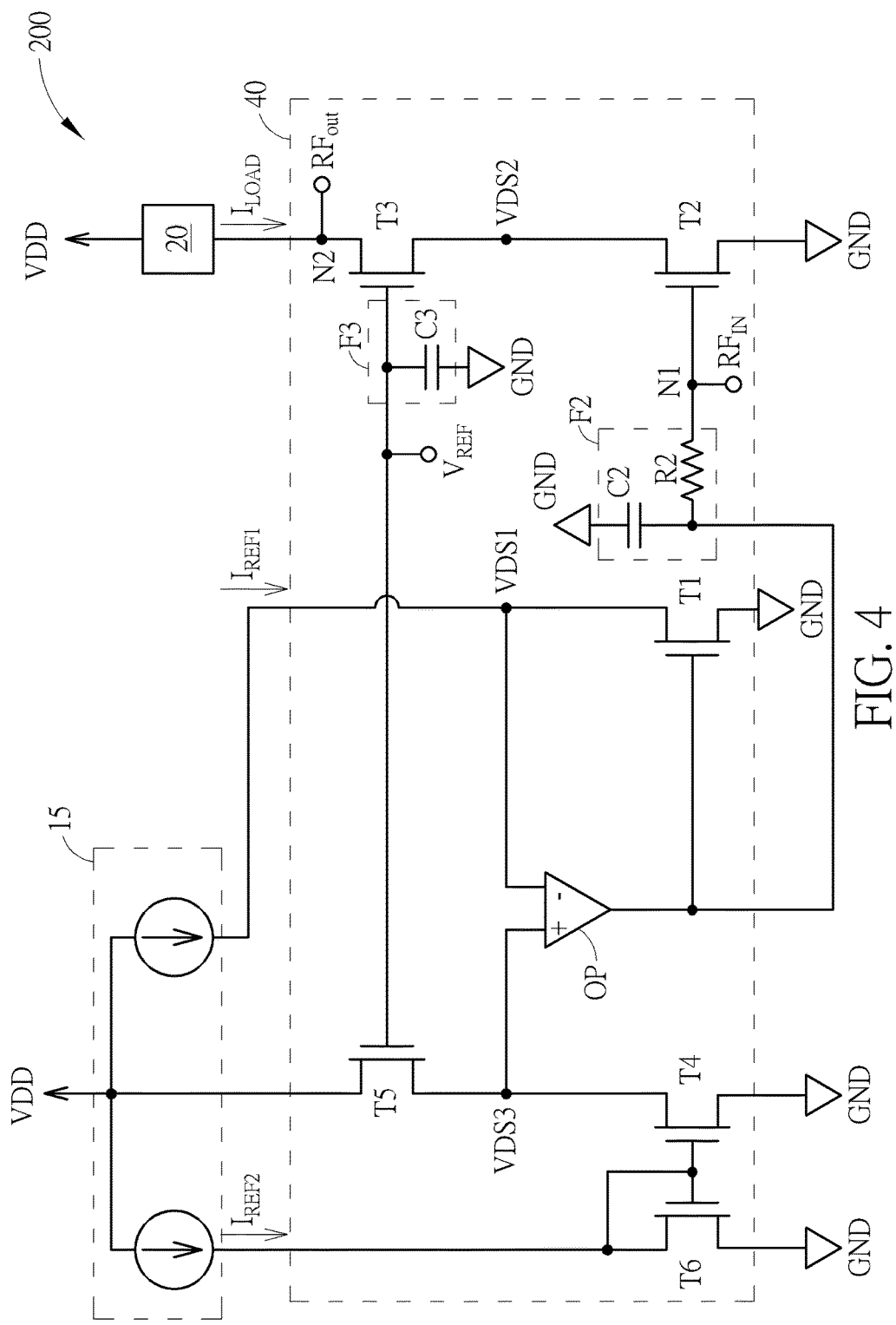
FIG. 4 is a diagram illustrating the implementation of the current mirror device in an amplifier circuit according to another embodiment of the present invention.

FIG. 3 is a diagram illustrating a current mirror device 40 according to another embodiment of the present invention. FIG. 4 is a diagram illustrating the implementation of the current mirror device 40 in an amplifier circuit 200 according to another embodiment of the present invention. As depicted in FIG. 4, the current mirror device 40 includes transistors T1-T5 and an operational amplifier OP. The amplifier circuit 200 further includes an input end N1 and an output end N2. In another embodiment of the present invention, the current mirror device 40 further includes a transistor T6, a resistor R2 and capacitors C2-C3. The amplifier circuit 200 is further coupled to a current source circuit 15 and a load circuit 20. VDD and GND present the bias voltages required to operate the current mirror device 40. The load circuit 20 may be an inductor coupled between the bias voltage VDD and the first end of the transistor T3. The current source circuit 15 may provide two sets of reference current $I_{REF1}$ and $I_{REF2}$. The current mirror device 40 is configured to amplify the reference current generated by the current source circuit 15 to become the load current $I_{LOAD}$ which flows through the transistor T3. In another embodiment of the present invention, the load current $I_{LOAD}$ which flows through the transistor T3 also flows through the load circuit 20. The amplifier circuit 200 is configured to receive an input signal $RF_{IN}$ at the input end N1. The load circuit 20 is configured to amplify the input signal $RF_{IN}$ to become an output signal $RF_{OUT}$ according to the load current $I_{LOAD}$ and provide the output signal $RF_{OUT}$ at the output end N2.

In the current mirror device 40, the operational amplifier OP and the transistors T1-T6 are three-terminal devices. With a first end serving as positive input end, a second end serving as negative input end, and a third end serving as output end, the operational amplifier OP can provide high input impedance and low output impedance. The first transistor T1 includes a first end coupled to the second end of the operational amplifier OP and the current source circuit 15 for receiving the reference current $I_{REF1}$, a second end coupled to the bias voltage GND, and a control end coupled to the output end of the operational amplifier OP. The second transistor T2 includes a first end coupled to the second end of the transistor T3, a second end coupled to the bias voltage GND, and a control end coupled to the input end N1 and the control end of the transistor T1. The transistor T3 includes a first end coupled to the output end N2, a second end coupled to the first end of the transistor T2, and a control end coupled to a reference voltage $V_{REF}$. The transistor T4 includes a first end coupled to the first end of the operational amplifier OP, a second end coupled to the bias voltage GND, and a control end coupled to the control end of the transistor T6. The transistor T5 includes a first end coupled to the bias voltage VDD, a second end coupled to the first end of the transistor T4, and a control end coupled to the reference voltage $V_{REF}$. The transistor T6 includes a first end coupled to the current source circuit 15 for receiving the reference current $I_{REF2}$, a second end coupled to the bias voltage GND, and a control end coupled to the first end of the transistor T6. The resistor R2 includes a first end coupled to the control end of the transistor T1 and the output end of the operational amplifier OP, and a second end coupled to the input end N1 and the control end of the transistor T2. The capacitor C2 includes a first end coupled between the resistor R2 and the control end of the transistor T1, and a second end coupled to the bias voltage GND. The capacitor C3 includes a first end coupled between the control end of the transistor T3 and the control end of the transistor T5, and a second end coupled to the bias voltage GND.

In the current mirror device 40 of an embodiment of the present invention, the resistor R2 and the capacitor C2 may form a filter circuit F2, while the capacitor C3 may form a filter circuit F3 so as to allow certain frequencies to pass. For example, the filter circuit F2 and the filter circuit F3 form a low-pass filter, thereby preventing the AC signals (such as high-frequency signals) in the input signal $RF_{IN}$ to be transmitted to the operational amplifier OP or the transistor T5 and hinder their operations. In this embodiment, the filter circuit F2 is coupled between the control end of the transistor T1 and the input end N1, and the filter circuit F3 is coupled between the control end of the transistor T3 and the control end of the transistor T5. In other embodiments of the present invention, the resistor R2 may be substituted by an inductor or by an inductor-capacitor parallel circuit. However, the method of implementing the filter circuit in the current mirror device 40 does not limit the scope of the present invention.

In the current mirror circuit 40 an embodiment of the present invention, the transistors T1-T6 may be MOSFETs or other devices having similar functions. In the current mirror device formed by the transistors T1-T6, the W/L ratio of the transistor T2 is m times larger than the W/L ratio of the transistor T1, wherein m is a positive integer. For illustrative purposes, it is assumed that the current mirror device 40 is implemented with N-type MOSFETs, each of which has a drain (first end), a source (second end), and a gate (control end). However, the types of the transistors T1-T6 do not limit the scope of the present invention.

In the current mirror circuit 40 of an embodiment of the present invention, since the transistor T4 is unable to lock the source voltage of the transistor T5, the source voltage of the transistor t5 is at a floating level whose value may be determined by the bias voltage VDD and the characteristic of the transistor T5 (such as the gate-source voltage VGS of the transistor T5). Also, the transistors T1 and T2 vary in fabrication parameters in a consistent direction, while the transistors T3 and T5 vary in fabrication parameters in a consistent direction. That is, the transistors T1 and T2 are located in the same corner or in neighboring corners, while the transistors T3 and T5 are located in the same corner or in neighboring corners.

As previously stated, a current mirror device may not be able to supply output current which is an accurate copy of input current due to channel length modulation effect. Therefore, in the current mirror device 40 of an embodiment of the present invention, the drain voltages of the transistors T1, T2 and T4 are locked using the electrical characteristic of the operational amplifier OP (high input impedance and low output impedance), and the gate voltages of the transistors T1 and T2 are locked using a feedback mechanism. More specifically, when the transistor T6 receives the reference current $I_{REF2}$, the reference current $I_{REF2}$ is mirrored to become the current which flows through the transistors T4 and T5, so that the voltage VDS3 at the drain of the transistor T4 and the source of the transistor T5 may be supplied by the difference between the reference voltage $V_{REF}$ and the gate-source voltage of the transistor T5. By adjusting the value of the reference voltage $V_{REF}$ or the W/L ratio of any of the transistors T4-T6, the operational amplifier OP may drive the gates of the transistors T1 and T2 so as to lock the drain voltages of the transistors T1 and T2 (VDS1=VDS2=VDS3). An embodiment of the present invention is able to reduce the impact of the transistor bias current variations on the PVT by keeping the drain voltages the transistors T1-T2 substantially at the same level. Since the W/L ratio of the transistor T2 is m times larger than the W/L ratio of the transistor T1, the reference current $I_{REF1}$ flowing through the transistor T1 may be amplified m times to become the load current $I_{LOAD}$ flowing through the transistor T2 ($I_{LOAD}$=m*$I_{REF1}$).

Figure 5:
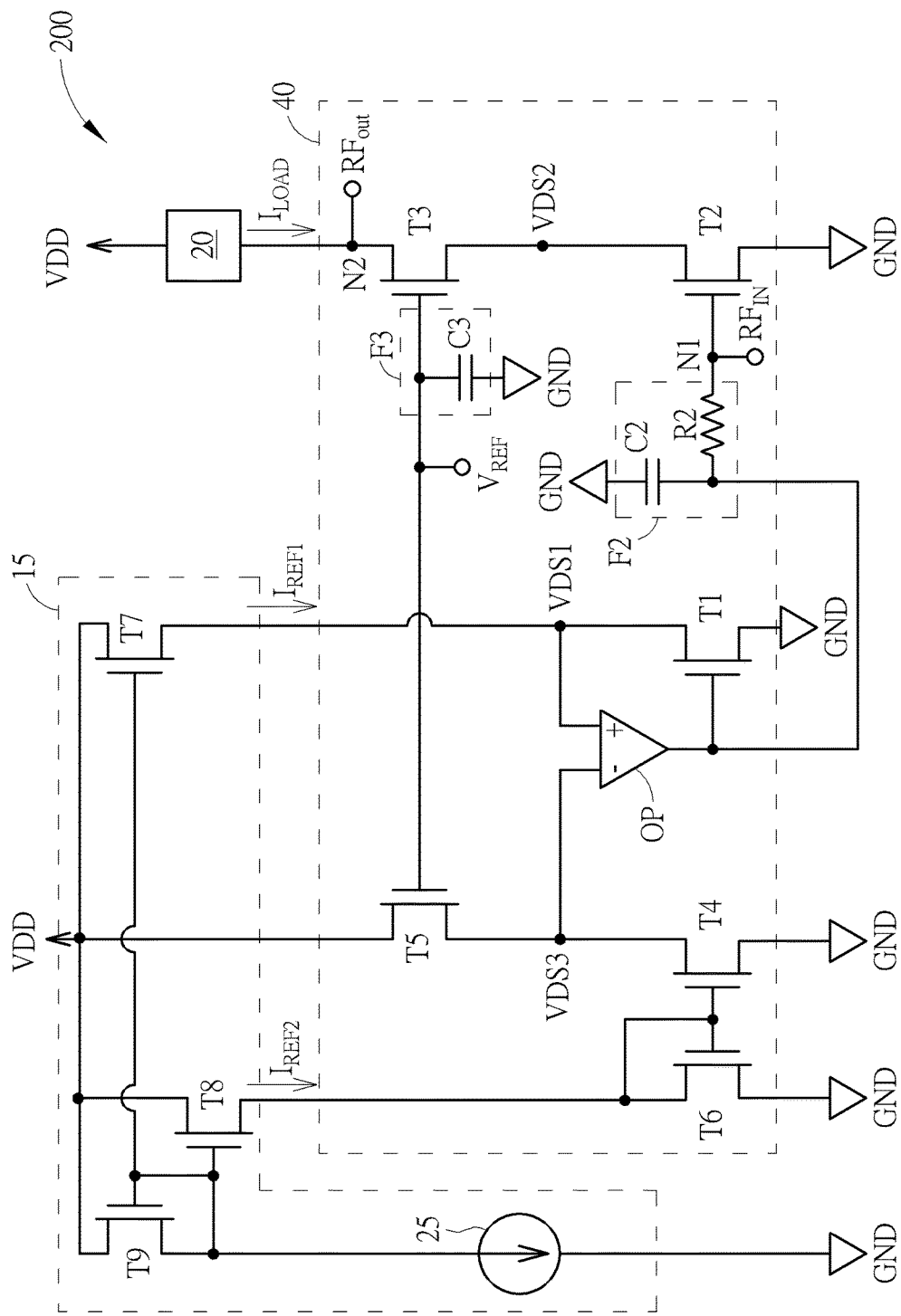
FIG. 5 is a diagram illustrating the implementation of the current source circuit in the amplifier circuit according to an embodiment of the present invention.

FIG. 5 is a diagram illustrating the implementation of the current source circuit 15 in the amplifier circuit 200 according to an embodiment of the present invention. As depicted in FIG. 5, the current source circuit 15 may be implemented with a current source 25 and transistors T7-T9. The transistor T7 includes a first end coupled to the bias voltage VDD, a second end for outputting the reference current $I_{REF1}$, and a control end. The transistor T8 includes a first end coupled to the bias voltage VDD, a second end for outputting the reference current $I_{REF2}$, and a control end coupled to the control end of the transistor T7. The transistor T9 includes a first end coupled to the bias voltage VDD, a second end coupled to the control end of the transistor T7, and a control end coupled to the control end of the transistor T7. The current source 25 is coupled between the second end of the transistor T9 and the bias voltage GND. With a first end serving as negative input end (VDS3), a second end serving as positive input end (VDS1), and a third end serving as output end, the operational amplifier OP can provide high input impedance, low output impedance and a negative feedback loop formed by the output end of the operational amplifier OP, the transistor T1 and the positive input end of the operational amplifier OP in the amplifier circuit 200.

In the embodiments depicted in FIGS. 1-4, the first end of the operational amplifier OP end serves as positive input end, while the second end of the operational amplifier OP serves as negative input end. In other embodiments, the first end of the operational amplifier OP end may serve as negative input end, while the second end of the operational amplifier OP may serve as positive input end.

In conclusion, the embodiment of the present invention locks the drain voltages of two transistors using the electrical characteristic of an operational amplifier, thereby reducing the impact of the transistor bias current variations on the PVT. This way, the reference current $I_{REF}$ or $I_{REF1}$ flowing through the transistor T1 may be amplified m times to become the load current $I_{LOAD}$ flowing through the transistor T2. Therefore, the amplifier circuit and the current mirror device according to the present invention can improve the stability and accuracy of output current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
   an input end arranged to receive an input signal;
   an output end arranged to output the input signal after being amplified;
   a first transistor including:
     a first end arranged to receive first reference current;
     a second end arranged to receive a first bias voltage; and
     a control end;
   a second transistor including:
     a first end;
     a second end coupled to the first bias voltage; and
     a control end coupled to the input end and the control end of the first transistor;
   a third transistor including:
     a first end coupled to the output end;
     a second end coupled to the first end of the second transistor; and
     a control end coupled to a reference voltage; and
   an operational amplifier configured to keep a first voltage level at the first end of the first transistor substantially equal to a second voltage level at the first end of the second transistor, and comprising:
     a first end coupled to the first end of the first transistor;
     a second end coupled to the first end of the second transistor; and
     an output end coupled to the control end of the first transistor; and
   a first filter circuit coupled between the first end of the second transistor and the second end of the operational amplifier.

2. The amplifier circuit of claim 1, further comprising:
   a second filter circuit coupled between the control end of the first transistor and the input end.

3. The amplifier circuit of claim 1, wherein the first transistor and the second transistor vary in fabrication parameters in a first consistent direction.

4. The amplifier circuit of claim 1, further comprising:
   a fourth transistor including:
     a first end;
     a second end coupled to the first bias voltage; and
     a control end; and
   a fifth transistor including:
     a first end coupled to a second bias voltage;
     a second end coupled to the first end of the fourth transistor; and
     a control end coupled to the control end of the third transistor.

5. The amplifier circuit of claim 4, wherein the third transistor and the fifth transistor vary in fabrication parameters in a second consistent direction.

6. The amplifier circuit of claim 4, further comprising:
   a sixth transistor including:
     a first end arranged to receive second reference current;
     a second end coupled to the first bias voltage; and
     a control end coupled to the control end of the fourth transistor and the first end of the sixth transistor.

7. The amplifier circuit of claim 6, wherein the fourth transistor and the sixth transistor vary in fabrication parameters in a third consistent direction.

8. The amplifier circuit of claim 4, wherein the operational amplifier comprises:
   a first end coupled to the first end of the fourth transistor;
   a second end coupled to the first end of the first transistor; and
   an output end coupled to the control end of the first transistor.

9. The amplifier circuit of claim 1, wherein the amplifier circuit is coupled to a load circuit which is coupled between the first end of the third transistor and a second bias voltage.

10. A current mirror device, comprising:
    a first transistor including:
      a first end arranged to receive first reference current;
      a second end coupled to a first bias voltage; and
      a control end;
    a second transistor including:
      a first end;
      a second end coupled to the first bias voltage; and
      a control end coupled to the control end of the first transistor;
    a third transistor including:
      a first end;
      a second end coupled to the first end of the second transistor; and
      a control end coupled to a reference voltage;
    a fourth transistor including:
      a first end;
      a second end coupled to the first bias voltage; and
      a control end;
    a fifth transistor including:
      a first end coupled to a second bias voltage;
      a second end coupled to the first end of the fourth transistor; and
      a control end coupled to the control end of the third transistor; and
    an operational amplifier including:
      a first end coupled to the first end of the fourth transistor;
      a second end coupled to the first end of the first transistor; and
      an output end coupled to the control end of the first transistor.

11. The current mirror device of claim 10, further comprising:
    a sixth transistor including:
      a first end arranged to receive second reference current;
      a second end coupled to the first bias voltage; and a control end coupled to the control end of the fourth transistor and the first end of the sixth transistor.

12. The current mirror device of claim 10, wherein:
the control end of the second transistor is coupled to an input end configured to receive an input signal; and
the first end of the third transistor is coupled to an output end configured to output the input signal after being amplified.

13. The current mirror device of claim 12, further comprising:
a second filter circuit coupled between the control end of the first transistor and the input end.

14. The current mirror device of claim 10, further comprising:
a third filter circuit coupled between the control end of the third transistor and the control end of the fifth transistor.

15. The current mirror device of claim 12, wherein the current mirror device is coupled to a load circuit which is coupled between the first end of the third transistor and a second bias voltage.

16. The current mirror device of claim 10, further comprising:
a seventh transistor including:
a first end coupled to a second bias voltage;
a second end configured to output the first reference current; and
a control end; and
a ninth transistor including:
a first end coupled to the second bias voltage;
a second end; and
a control end coupled to the second end and the control end of the seventh transistor.

17. The current mirror device of claim 16, further comprising a current source coupled to the second end of the ninth transistor.

18. The current mirror device of claim 11, further comprising:
an eighth transistor including:
a first end coupled to a second bias voltage;
a second end configured to output the second reference current; and
a control end; and
a ninth transistor including:
a first end coupled to the second bias voltage;
a second end; and
a control end coupled to the second end and the control end of the eighth transistor.

* * * * *